United States Patent
Yamada (10) Patent No.: US 8,618,424 B2
(45) Date of Patent: Dec. 31, 2013

(54) MULTILAYER WIRING SUBSTRATE AND METHOD OF MANUFACTURING THE SAME

(75) Inventor: Tomoko Yamada, Nagano (JP)

(73) Assignee: Shinko Electric Industries Co., Ltd., Nagano-shi (JP)

(*) Notice: Subject to any disclaimer, the term of this patent is extended or adjusted under 35 U.S.C. 154(b) by 364 days.

(21) Appl. No.: 12/969,961

(22) Filed: Dec. 16, 2010

(65) Prior Publication Data

US 2011/0155439 A1 Jun. 30, 2011

(30) Foreign Application Priority Data

Dec. 24, 2009 (JP) ................. 2009-292910

(51) Int. Cl.
*H05K 1/11* (2006.01)

(52) U.S. Cl.
USPC .......................... 174/264; 174/261

(58) Field of Classification Search
USPC .......... 174/264, 260, 261, 262, 265; 361/762
See application file for complete search history.

(56) References Cited

U.S. PATENT DOCUMENTS

2009/0200069 A1* 8/2009 Kariya et al. ............... 174/255

FOREIGN PATENT DOCUMENTS

| JP | 2004-193278 A | 7/2004 |
|---|---|---|
| JP | 2004-311919 | 11/2004 |
| JP | 2004-356219 | 12/2004 |

* cited by examiner

*Primary Examiner* — Jeremy Norris
*Assistant Examiner* — Tremesha S Willis
(74) *Attorney, Agent, or Firm* — Rankin, Hill & Clark LLP (57) ABSTRACT

The multilayer wiring substrate includes: a first insulating layer comprising a first surface and a second surface opposite to the first surface; a second insulating layer on the first surface of the first insulating layer; a first wiring pattern on the second surface of the first insulating layer; a second wiring pattern on a surface of the second insulating layer; a first via formed through the first insulating layer; a second via formed through the second insulating layer; and a third wiring pattern formed on the first surface of the first insulating layer and embedded in the second insulating layer, the third wiring pattern having a hole therethrough. A diameter of the hole is smaller than each diameter of the first and second vias. The first via and the second via are connected to each other through a metal filled in the hole of the third wiring pattern.

4 Claims, 8 Drawing Sheets

MULTILAYER WIRING SUBSTRATE AND METHOD OF MANUFACTURING THE SAME

This application claims priority from Japanese Patent Application No. 2009-292910, filed on Dec. 24, 2009, the entire contents of which are herein incorporated by reference.

BACKGROUND

1. Technical Field

The present invention relates to a multilayer wiring substrate and a method of manufacturing the same.

2. Related Art

In a multilayer wiring substrate in which wiring patterns are connected to each other via an insulating layer, an electrical connection between the respective wiring patterns is performed by a via that passes through the insulating layer. In such a multilayer wiring substrate, for example, JP-A-2004-356219 describes a multilayer wiring substrate shown in FIG. 10. In this multilayer wiring substrate, wiring patterns 102 are formed on one surface of a resin film 100, then resin layers 104 are formed between the respective wiring patterns 102. Concave portions 106 are formed through the resin layers 104 to expose the wiring patterns 102 by the laser beam, and then vias 108 are formed by filling a plating metal in the concave portions 106. Thus, the wiring pattern 102 is provided between the vias 108 facing each other.

JP-A-2004-311919 describes a via forming method as shown in FIGS. 11A to 11D. In this method, a through hole 202 shaped like a hand-drum is formed in an insulation substrate 200 (see FIG. 11A). Then, a thin film metal 204 is formed on the entire surface of the insulation substrate 200, including an inner wall surface of the through hole 202, by the electroless plating (see FIG. 11B).

Figure 11A:
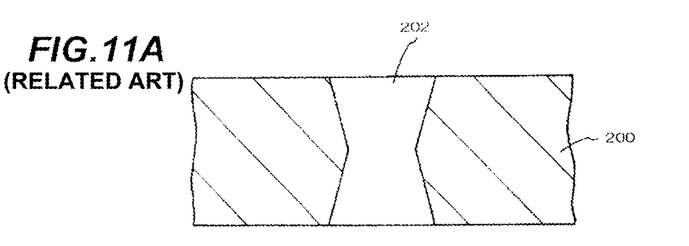
FIGS. 11A to 11D are views explaining steps of filling a plating metal in a through hole 202 in the related art.
Figure 11B:
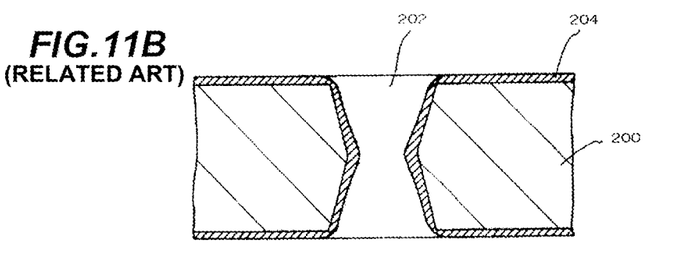
Figure 11C:
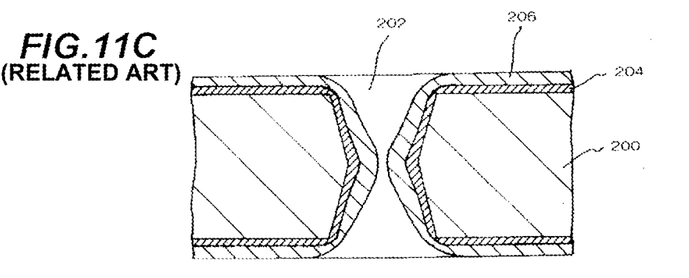

Then, a plating metal layer 206 is formed by the electroplating using the thin film metal 204 as a power feeding layer (see FIG. 11C). At that time, electric charges are concentrated on a protruding portion that protrudes into the through hole 202, and thus the plating metal layer 206 is formed to cover the protruding portion of the through hole 202 such that the thickness of the plating metal layer 206 is larger than those of other portions.

Figure 11D:
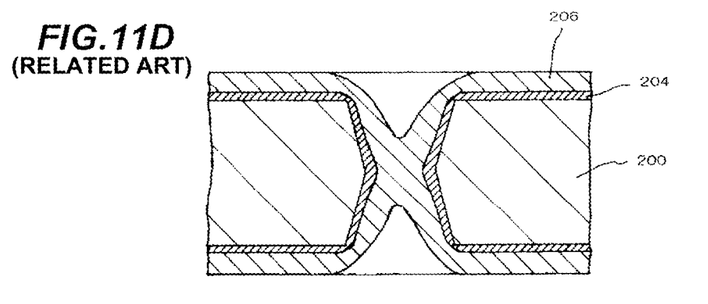

Then, through the successive electroplating process, the protruding portions that protrude into the through hole 202 are connected to each other via the plating metal layer 206, as shown in FIG. 11D. Thus, the plating metal layer 206 is filled in the through hole 202, so that the via can be formed.

Figure 10:
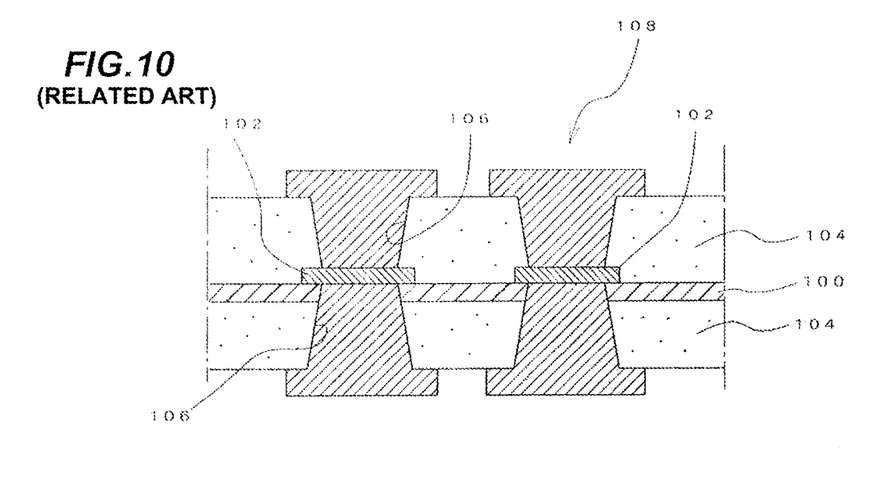
FIG. 10 is a cross-sectional view explaining a multilayer wiring substrate in the related art.

In the multilayer wiring substrate described in JP-A-2004-356219, the vias 108 can be formed relatively simply. The vias 108 are formed by filling the plating metal in the concave portions 106 from the exposed surfaces of the wiring patterns 102, and the plating metals filled in the concave portions 106 are connected to each other via the wiring pattern 102. In case where the plating metal filled in the concave portion 106 and the wiring pattern 102 are not suitably connected to each other, and further a tensile stress is given to the via 108 in the longitudinal direction, the plating metal filled in the concave portion 106 might be peeled off from the concave portion 106.

Meanwhile, in the via forming method described in JP-A-2004-311919, the via is formed by filling the plating metal in the through hole 202. Accordingly, a portion of the via is not peeled off from the through hole 202.

However, there is a problem in that it is difficult to form the through hole 202 in insulation substrate 200. In some cases, depending on the protruding portion that protrudes into the through hole 202, an opening of the through hole 202 might be blocked by the plating metal layer before the protruding portions are sufficiently connected to each other via the plating metal layer. Thus, voids may be generated in the via.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

Accordingly, it is an illustrative aspect of the present invention to provide a multilayer wiring substrate, a method of manufacturing the multilayer wiring substrate, capable of eliminating such a risk that either a part of the via may be peeled off or voids may be generated in the via, from the via that is formed by the plating.

According to one or more aspects of the invention, there is provided a multilayer wiring substrate. The multilayer wiring substrate includes: a first insulating layer comprising a first surface and a second surface opposite to the first surface; a second insulating layer on the first surface of the first insulating layer; a first wiring pattern on the second surface of the first insulating layer; a second wiring pattern on a surface of the second insulating layer, the second wiring pattern being opposed to the first wiring pattern; a first via formed through the first insulating layer and electrically connected to the first wiring pattern; a second via formed through the second insulating layer and electrically connected to the second wiring pattern, the second via being opposed to the first via; and a third wiring pattern formed on the first surface of the first insulating layer and embedded in the second insulating layer, the third wiring pattern having a hole therethrough, wherein a diameter of the hole is smaller than each diameter of the first and second vias, and wherein the first via and the second via are connected to each other through a metal filled in the hole of the third wiring pattern.

According to one or more aspects of the present invention, there is provided a method of manufacturing a multilayer wiring substrate. The method includes: (a) forming a first wiring, pattern on a first insulating layer; (b) forming a second insulating layer on the first insulating layer such that the first wiring pattern is covered by the second insulating layer: (c) forming a first via hole in the first insulating layer to expose one surface of the first wiring pattern; (d) forming a second via hole in the second insulating layer to expose the other surface of the first wiring pattern; (e) forming a hole through the first wiring pattern; (f) forming a metal film on the first and second insulating layers, such that the first wiring pattern and portions of the first and second insulating layers corresponding to the first and second via holes are covered by the metal film and such that the hole of the first wiring pattern is filled with the metal film; and (g) filling the first and second via holes with a metal material by electroplating using the metal film as a feeding layer, thereby forming a first via and a second via, wherein the first via and the second via are connected to each other through the metal film filled in the hole of the first wiring pattern.

Other aspects and advantages of the present invention will be apparent from the following description, the drawings and the claims.

DETAILED DESCRIPTION OF EXEMPLARY EMBODIMENTS

Hereinafter, exemplary embodiments of the present invention will be described with reference to the accompanying drawings. In all the drawings for the explanation of the embodiments, the members having the same functions are represented by the same reference numerals, and repeated description thereof will be omitted.

Figure 1:
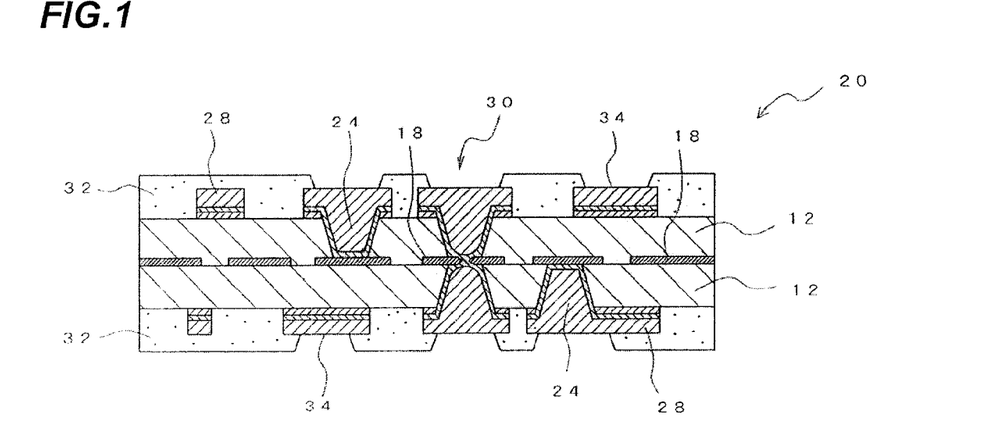
FIG. 1 is a cross-sectional view of a multilayer wiring substrate 20 according to an embodiment of the invention.

As shown in FIG. 1, in a multilayer wiring substrate 20, three wiring patterns 18, 28, 28 are formed on the insulating layers 12 made of resin. Out of the three wiring patterns 18, 28, 28, the wiring pattern 18 is provided between the wiring patterns 28, 28 (referred to as the "intermediate wiring pattern 18" hereinafter). Also, the wiring patterns 28, 28 are provided on both surfaces of the multilayer wiring substrate 20 (referred to as "wiring patterns 28" hereinafter).

The intermediate wiring pattern 18 and one of wiring patterns 28 are connected electrically through a via 24 that passes through the insulating layer 12.

Also, the intermediate wiring pattern 18 and the wiring patterns 28, 28 are connected electrically to each other through vias 30 passing through the insulating layers 12, 12 respectively.

Except a pad 34 on which an external connection terminal is to be mounted, the wiring pattern 28 is covered with a solder resist 32.

In the multilayer wiring substrate 20 shown in FIG. 1, the via 30 connects electrically the intermediate wiring pattern 18 and the wiring patterns 28, 28 mutually. Also, as shown in FIG. 2, the via 30 is formed to pass through the insulating layers 12, 12 and the intermediate wiring pattern 18.

The via 30 is formed by filling the plating metal in a through hole formed through the insulating layer 12. Also, a small hole 38 is formed to pass through a portion of the intermediate wiring pattern 18, which is exposed from bottom surfaces of concave portions 36. The concave portions 36 are formed in the insulating layers 12 to expose the intermediate wiring pattern 18, respectively. The diameter of the small hole 38 is smaller than an inner diameter of the bottom surface of the concave portion 36. The vias 30 are formed such that the plating metals filled in the concave portions 36 are connected integrally via the small hole 38.

In this case, each of the concave portions 36 is formed in a taper shape, and an inner diameter of the concave portion 36 is gradually decreased toward the intermediate wiring pattern 18.

Figure 2:
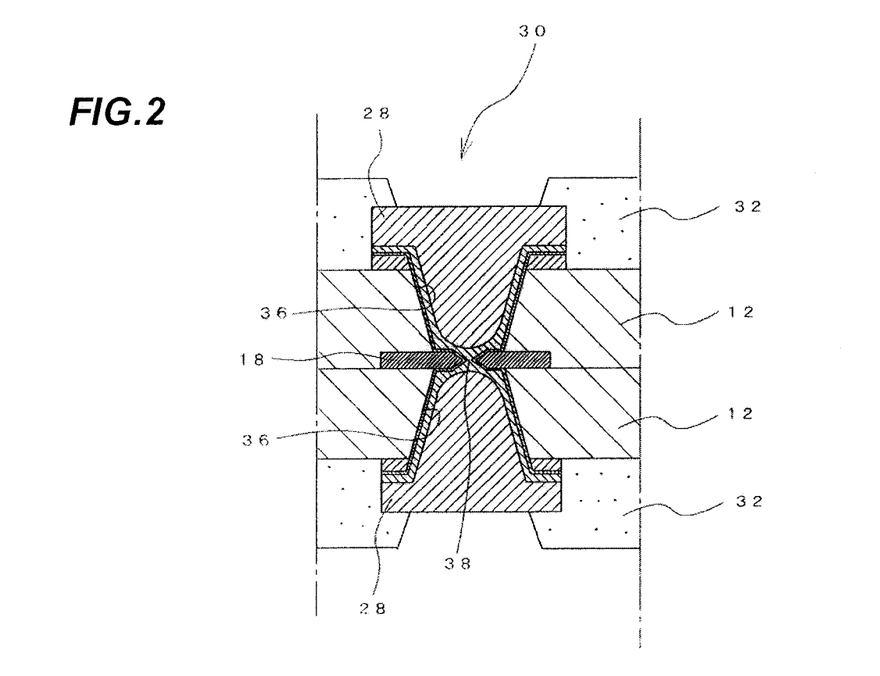
FIG. 2 is an enlarged cross-sectional view of a via 30 formed on the multilayer wiring substrate 20 shown in FIG. 1.

The multilayer wiring substrate 20 shown in FIGS. 1 and 2 can be manufactured in accordance with steps shown in FIGS. 3A to 4C.

Figure 3A:
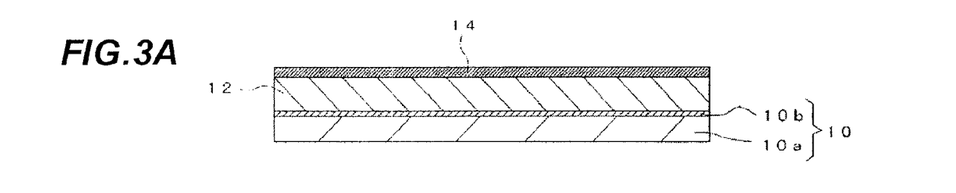
FIGS. 3A to 3F are views showing steps of manufacturing the multilayer wiring substrate 20 shown in FIG. 1.

First of all, as shown in FIG. 3A, a copper foil 14 is laminated on a metal layer 10b of a metal foil 10 through the insulating layer 12 made of resin. The thickness of the copper foil 14 is larger than that of the metal layer 10b. The thickness of the copper foil 14 may be about 18 µm, for example.

The copper foil 14 is laminated on the metal foil 10 by applying the heat/pressure while using a semi-cured thermosetting resin sheet as the insulating layer 12.

Figure 5:
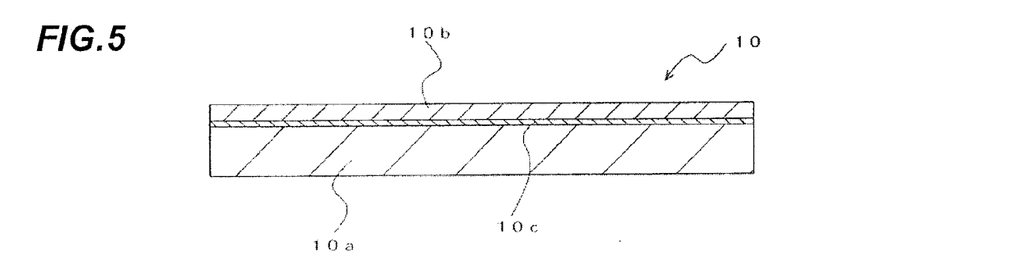
FIG. 5 is a cross-sectional view of a metal foil 10 used in the manufacturing steps shown in FIGS. 3A to 4C.

Also, as shown in FIG. 5, the metal layer 10b is provided on one surface of a carrier plate 10a (strong supporting member) via a peeling layer 10c. A copper plate having a thickness of about 15 to 17 µm may be used as the carrier plate 10a, and a copper foil having a thickness of about 0.5 to 12 µm may be used as the metal layer 10b.

Figure 3B:
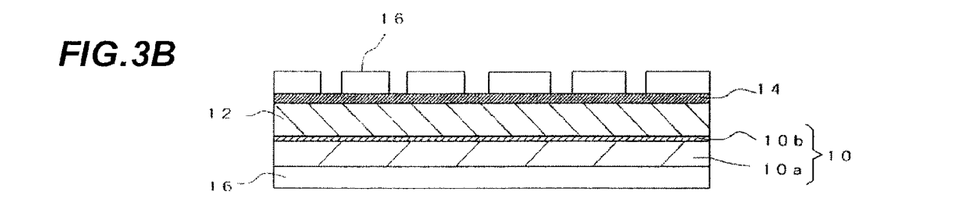

Then, as shown in FIG. 3B, a surface of the copper foil 14 shown in FIG. 3A is covered partially with a dry film 16. At this time, an entire surface of the carrier plate 10a is also covered with the dry film 16.

Given portions of the dry film 16 is etched to expose the surface of the copper foil 14, and then the dry film 16 is removed.

Figure 3C:
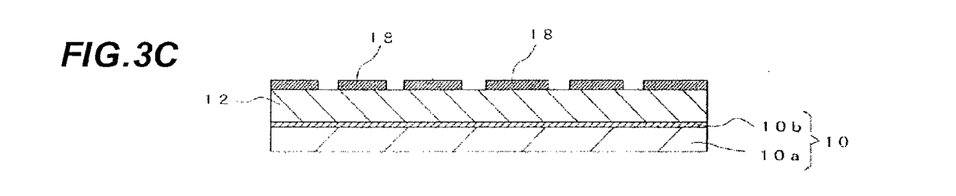

Thus, as shown in FIG. 3C, the intermediate wiring patterns 18 are formed. The intermediate wiring patterns 18 are to be formed in the center portion of the multilayer wiring substrate 20 (as described later), and thus these wiring patterns can be used as a power feeding layer or a ground layer.

Figure 3D:
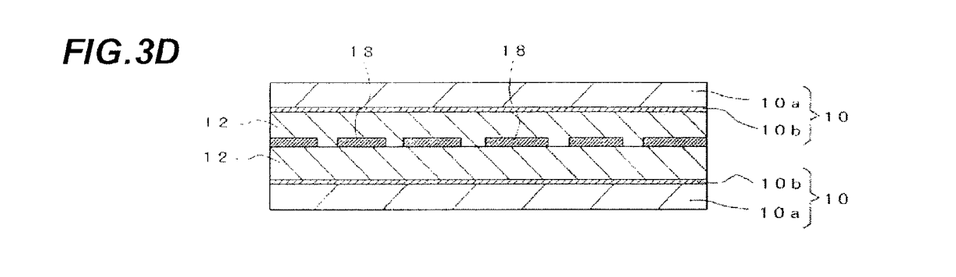

Then, as shown in FIG. 3D, the metal foil 10 is provided on the insulating layer 12 such that the metal layer 10b contacts the insulating layer 12. In this case, the insulating property of the metal foil 10 can be ensured by applying the heat/pressure while using a semi-cured thermosetting resin sheet as the insulating layer 12.

Figure 3E:
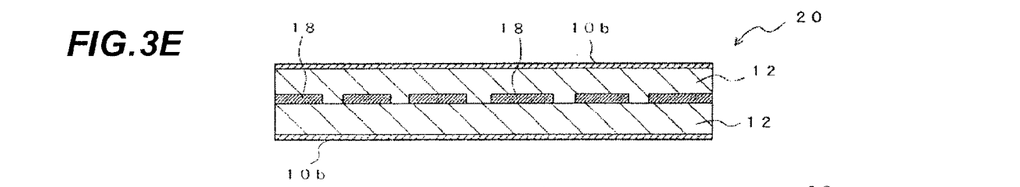

The carrier plates 10a are peeled from the metal foils 10, respectively. Thus, as shown in FIG. 3E, in the multilayer wiring substrate 20, the metal layer 10b is provided on both surfaces of the insulating layer 12.

In the multilayer wiring substrate 20, the insulating layer 12 is formed to cover the intermediate wiring patterns 18. Therefore, the multilayer wiring substrate 20 can be conveyed even after the carrier plates 10a serving as strong support member are peeled off.

Figure 3F:
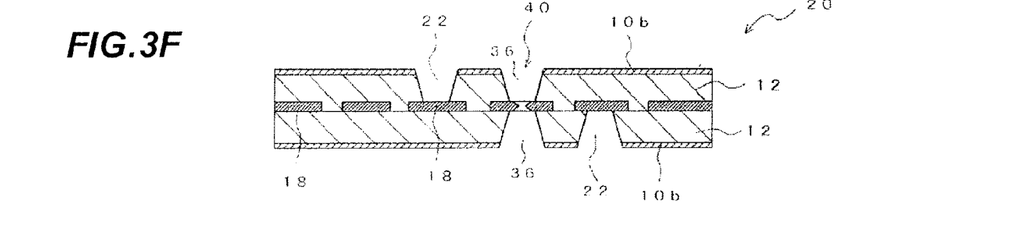

Then, as shown in FIG. 3F, concave portions 22, 36 are formed in predetermined positions of the metal layer 10b by the laser beam machining, respectively. The concave portions 22, 36 are formed to expose the intermediate wiring pattern 18. Also, the concave portion 22 and 36 are formed like a taper-shape, and the inner diameters thereof are gradually decreased toward the intermediate wiring pattern 18.

Figure 6:
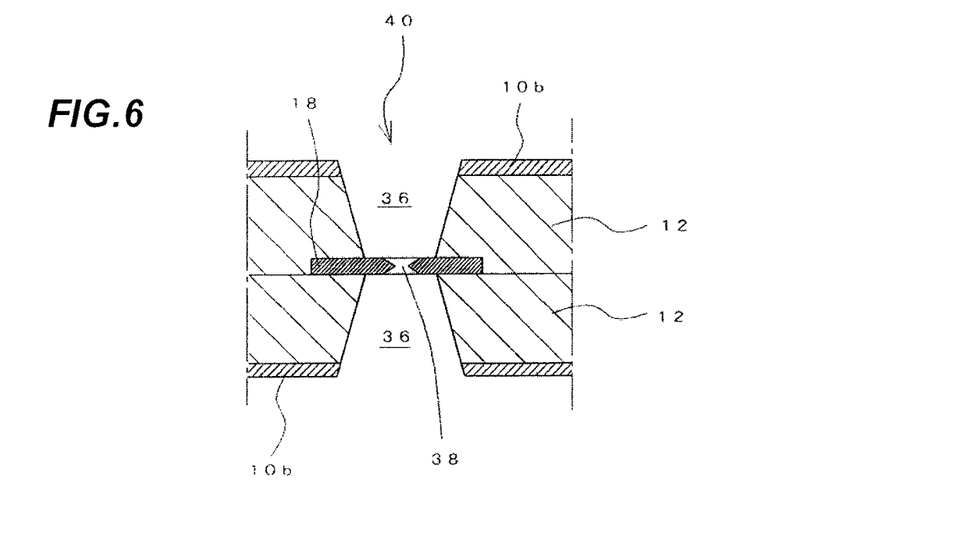
FIG. 6 is an enlarged cross-sectional view showing a through hole 40 shown in FIG. 3F.

The concave portion 36 is formed through the insulating layer 12 to expose the both surfaces of the intermediate wiring pattern 18, and a through hole 40 is formed by two concave portions 36. Then, as shown in FIG. 6, the small hole 38 is formed through the intermediate wiring pattern 18. The small hole 38 has a diameter smaller than an inner diameter of the bottom surface of the concave portion 36. The small hole 38 is formed by irradiating both exposed surfaces of the intermediate wiring pattern 18 with laser beam, while the concave portions 36, 36 are formed using the laser beam.

Figure 7:
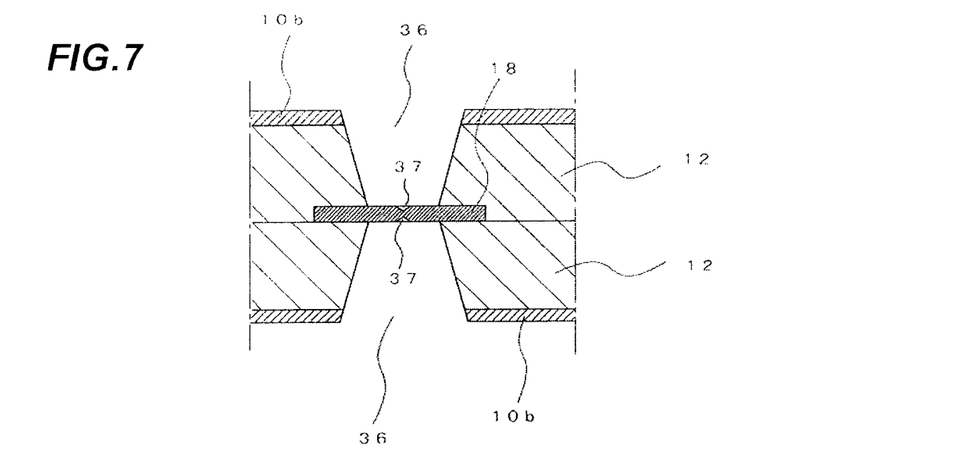
FIG. 7 is an enlarged cross-sectional view showing another step of manufacturing the through hole 40 shown in FIG. 3F.

In the above description, the concave portions 36, 36 are formed by irradiating both exposed surfaces of the intermediate wiring pattern 18 with laser beam. In this step, only concave portions 37, 37 might be formed while the small hole 38 is not formed, as shown in FIG. 7. The small hole 38 shown in FIG. 6 may be formed by etching the exposed surfaces of the intermediate wiring pattern 18. In order to make the processing of the metal layer 10b, 10b simple, the small hole 38 may be formed upon thinning the metal layer 10b, 10b by etching process.

In this manner, the etching process is applied to both exposed surfaces of the intermediate wiring pattern 18, so that the small hole 38 is formed. The small hole 38 is formed like a tapered shape, and the diameter of the small hole 38 is gradually increased toward both surfaces of the intermediate wiring pattern 18.

Also, it is advantageous that a maximum value of the diameter of the small hole 38 is more than twice a minimum value of the diameter of the small hole 38.

With this configuration, the plating metals filled in the concave portions 36, 36 respectively can be surely coupled to each other through the plating metal filled in the small hole 38.

The residues generated in forming the concave portion 22 and the through hole 40 by the laser beam are removed by applying the desmear process to the substrate 20. Then, the concave portion 22 and the through hole 40 are filled with the plating metal. The plating metal is filled into the through hole 40 such that the small hole 38 is filled with the plating metal, and then the concave portions 36 is filled with the plating metal.

Figure 4A:
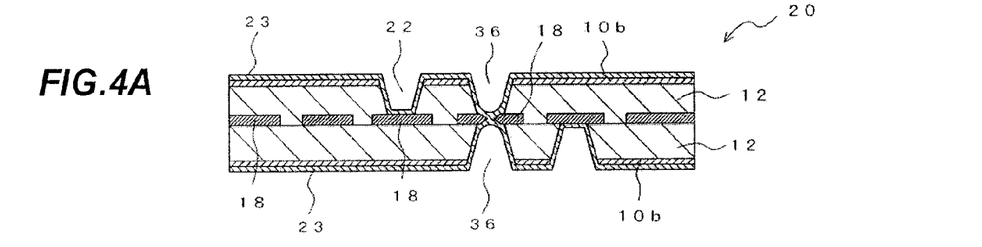
FIGS. 4A to 4C are views showing steps of manufacturing the multilayer wiring substrate 20 shown in FIG. 1.

Firstly, as shown in FIG. 4A, a metal film 23 is formed on an entire surface of the substrate 20. including an inner wall surfaces of the concave portion 22 and the through hole 40, by the plating.

Figure 8A:
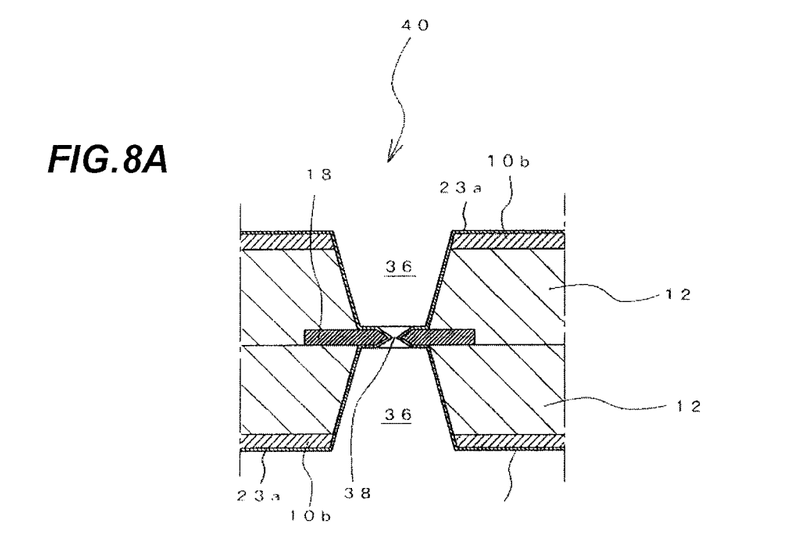
FIGS. 8A and 8B are views showing steps of forming a metal film 23 filled in a small hole 38 of the through hole 40 shown in FIG. 4A.
Figure 8B:
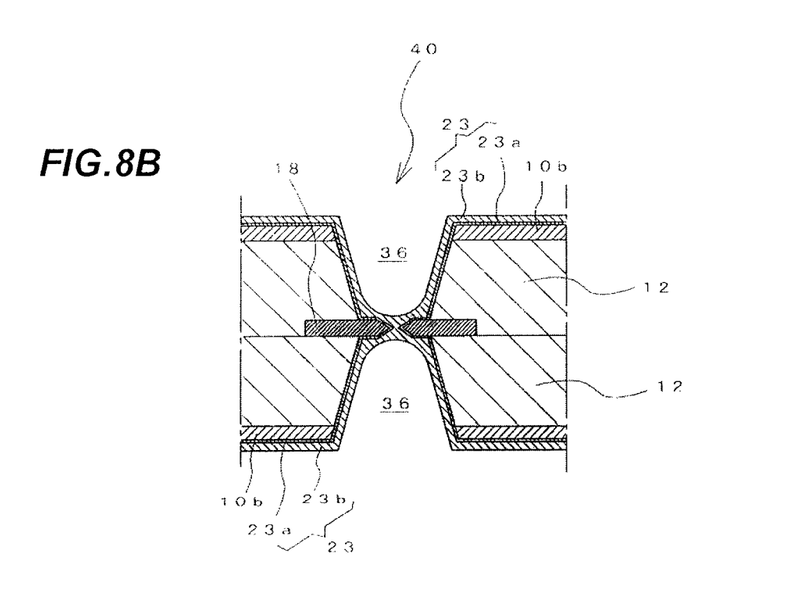

The small hole 38 formed through the intermediate wiring pattern 18 is covered with the metal film 23. In forming this metal film 23, as shown in FIG. 8A, firstly, a first metal layer 23a is formed on an entire surface of the substrate 20, including the inner wall surfaces of the concave portion 22 and the through hole 40 by the electroless plating. Then, a second metal layer 23b is formed by the electroplating using the first metal layer 23a as a power feeding layer. In this electroplating process, the electric charges are concentrated on the top end of the tapered protruding portion that protrudes into the small hole 38, and the plating metal is deposited on the top end portion of the small hole 38, so that the small hole 38 can be filled with the plating metal.

In FIG. 8A, the small hole 38 is covered with the metal film 23. However, the small hole 38 may be filled in the metal film 23.

Figure 9:
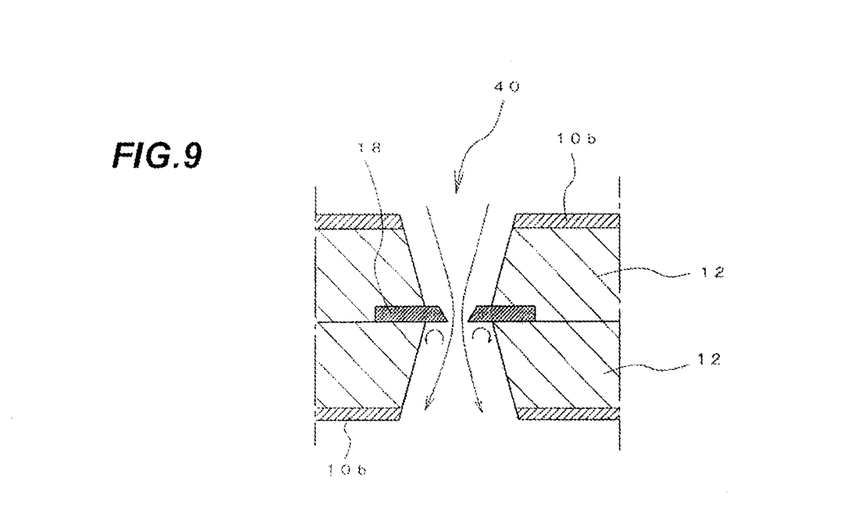
FIG. 9 is a view showing a shape of the small hole 38 of the through hole 40 and a flow of a plating solution.

In forming the small hole 38 in the intermediate wiring pattern 18, as shown in FIG. 9, the process of forming a hole may be applied from one surface side of the intermediate wiring pattern 18. In some cases, the small hole 38 may be formed like a tapered shape. For example, the small hole 38 may be formed in the intermediate wiring pattern 18 such that a diameter of the small hole 38 is gradually decreased from one surface of the intermediate wiring pattern 18 toward the other surface thereof.

At that time, it is likely that a stagnation region are formed in a flow of the plating solution during the electroless plating or the electroplating, and then spots are likely to be formed on the metal film 23.

Here, in the configuration shown in FIG. 9, the plating solution is filled into the small hole of the intermediate wiring pattern 18, from the one surface of the intermediate wiring pattern 18 toward the other surface thereof (A hole diameter on the one surface is larger than that on the other surface).

Figure 4B:
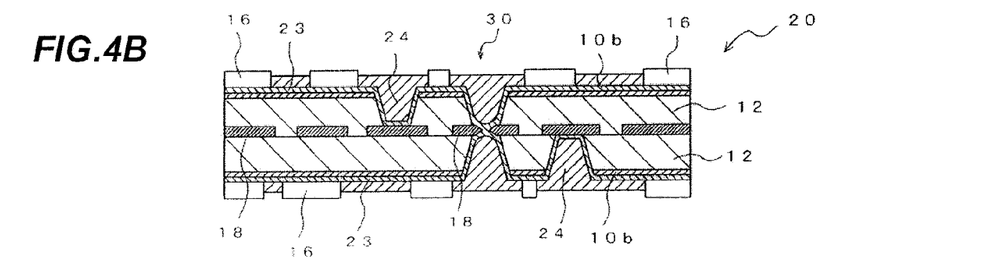

Then, as shown in FIG. 4B, the dry films 16 are formed on the respective metal films 23. which are formed on the respective metal layer 10b, and then patterns of the dry film 16 are formed. Here, the dry film 16 may be formed on the first metal layer 23a or the second metal layer 23b. Then, the via filling electroplating is applied while using the metal layer 10b and the metal film 23 as a power feeding layer, so that the vias 24, 30 is formed by filling the plating metal in the concave portions 22, 36, respectively. Also, the wiring patterns 28 are formed on both surfaces of the substrate 20 to be electrically connected to the intermediate wiring patterns 18, 18 via the vias 24, 30. In this electroplating, a via filling plating solution mixed with bis (3-sulfoproxyl) disulfidedisodium (SPS) may be used as a plating accelerator.

Figure 4C:
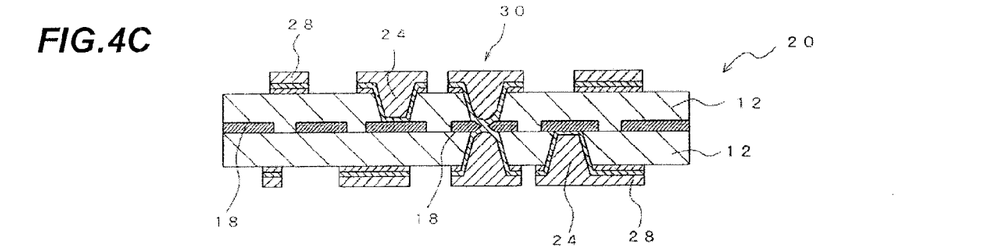

Then, the metal film 23 and the metal layer 10b that are exposed by peeling off the dry films 16, 16 are etched. Thus, as shown in FIG. 4C, the wiring patterns 28, 28 connected electrically to the intermediate wiring patterns 18, 18 via the vias 24, 30 can be formed on both surfaces of the substrate 20.

Then, the both surfaces of the substrate 20 except the portions where the pads 34 of the wiring patterns 28, 28 are formed are covered with the solder resist 32. Accordingly, the multilayer wiring substrate 20 shown in FIG. 1 can be obtained.

In this manner, in the method of manufacturing the multilayer wiring substrate shown in FIGS. 3A to 4C, the carrier plate 10a of the metal foil 10 is used as the strong supporting member until the metal layer 10b are provided on both surfaces the insulating layers 12 can be formed. Therefore, the stacked structure can be conveyed in the manufacturing steps without any trouble.

Also, in the multilayer wiring substrate 20 shown in FIG. 1, the plating metal filled in the concave portions 36 constituting the through hole 40 are coupled together via the small hole 38, so that the via 30 is formed. Thus, even when a tensile stress is applied in the longitudinal direction of the via 30 and further the plating metal filled in the concave portions 36 is not suitably connected to the intermediate wiring pattern 18, it is possible to prevent portions of the plating metal filled in the concave portions 36, 36 from being peeled off.

Furthermore, the plating metal can be filled into the via 30 through the small hole 38 formed through the intermediate wiring pattern 18. Accordingly, it is possible to prevent voids from being generated in the via 30, and also it is possible to obtain the via 30 densely filled with the plating metal.

According to the multilayer wiring substrate shown in FIG. 1 to FIG. 8B and the method of manufacturing the same, the small hole 38 formed through the intermediate wiring pattern 18 may be shaped like a circle, a square, a rectangle, or a slit.

Also, in the method of manufacturing the multilayer wiring substrate shown in FIGS. 3A to 4C, when the through hole 40 is filled with the plating metal, the second metal layer 23b is formed by the electroplating using the first metal layer 23a, which is formed by the electroless plating to cover the entire surface of the inner wall surface of the through hole 40, as a power feeding layer so as to fill the small hole 38 with the plating metal, and then the concave portions 36, 36 are filled with the plating metal by the electroplating using the second metal layer 23b as a power feeding layer.

When the small hole 38 has a small diameter, the small hole 38 may be filled with the metal by the electroless plating in forming the first metal layer 23a. In this case, the concave portions 36, 36 may be filled with the metal by the electroplating using the first metal layer 23a as a power feeding layer.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A multilayer wiring substrate, comprising:
   a first insulating layer comprising a first surface and a second surface opposite to the first surface;
   a second insulating layer on the first surface of the first insulating layer;
   a first wiring pattern on the second surface of the first insulating layer;
   a second wiring pattern on a surface of the second insulating layer, the second wiring pattern being opposed to the first wiring pattern;
   a first via formed through the first insulating layer and electrically connected to the first wiring pattern;
   a second via formed through the second insulating layer and electrically connected to the second wiring pattern, the second via being opposed to the first via; and
   a third wiring pattern formed on the first surface of the first insulating layer and embedded in the second insulating layer, the third wiring pattern having a hole therethrough, and
   wherein the first via and the second via are connected to each other through a metal filled in the hole of the third wiring pattern,
   wherein the third wiring pattern comprises a first surface and a second surface opposite to the first surface,
   wherein a diameter of the first via is gradually decreased toward the first surface of the third wiring pattern, and the first via comprises:
     a top surface contacting the first wiring pattern; and
     a bottom surface opposite to the top surface and contacting the first surface of the third wiring pattern,
   wherein a diameter of the second via is gradually decreased toward the second surface of the third wiring pattern, and the second via comprises:
     a top surface contacting the second wiring pattern; and
     a bottom surface opposite to the top surface and contacting the second surface of the third wiring pattern, and
   wherein a diameter of the hole is smaller than the bottom surfaces of the first via and the second via.

2. The substrate according to claim 1,
   wherein the diameter of the hole is gradually increased toward the first and second surfaces of the third wiring pattern.

3. The substrate according to claim 1, wherein a maximum value of the diameter of the hole is more than twice a minimum value thereof.

4. The substrate according to claim 1, wherein the diameter of the hole is gradually decreased in a direction from the first surface of the third wiring pattern to the second surface thereof.

* * * * *